(12) United States Patent
Lee

(10) Patent No.: US 10,620,731 B2
(45) Date of Patent: Apr. 14, 2020

(54) DISPLAY DEVICE

(71) Applicant: Aconic Inc., Gwangju (KR)

(72) Inventor: Min Jae Lee, Goyang-si (KR)

(73) Assignee: ACONIC INC., Gwangju (KR)

( * ) Notice: Subject to any disclaimer, the term of this patent is extended or adjusted under 35 U.S.C. 154(b) by 0 days.

(21) Appl. No.: 15/971,514

(22) Filed: May 4, 2018

(65) Prior Publication Data

US 2018/0364845 A1 Dec. 20, 2018

(30) Foreign Application Priority Data

Jun. 14, 2017 (KR) .................. 10-2017-0074751

(51) Int. Cl.
*G06F 3/044* (2006.01)
*G09G 3/36* (2006.01)
*H01L 27/12* (2006.01)
*G09G 3/3225* (2016.01)
*G06F 3/041* (2006.01)

(52) U.S. Cl.
CPC ............ *G06F 3/0412* (2013.01); *G06F 3/044* (2013.01); *G06F 3/0443* (2019.05); *G06F 3/0448* (2019.05); *G09G 3/3225* (2013.01); *G09G 3/3677* (2013.01); *H01L 27/124* (2013.01); *H01L 27/1214* (2013.01); *H01L 27/1255* (2013.01); *G06F 2203/04103* (2013.01); *G09G 2310/0278* (2013.01); *G09G 2310/08* (2013.01); *G09G 2320/0209* (2013.01)

(58) Field of Classification Search
CPC ...... G06F 3/041; G06F 3/0412; G06F 3/0416; G06F 3/044; G06F 2203/04104; G09G 3/3208–3/3291; G09G 3/36–3/3696; G09G 2310/0278; G09G 2310/08; G09G 2320/0209; G09G 2300/0413; G09G 2300/0443; G09G 2300/0456; H01L 27/124–27/1248; H01L 27/1255
See application file for complete search history.

(56) References Cited

U.S. PATENT DOCUMENTS

| | | | | |
|---|---|---|---|---|
| 2011/0128262 A1* | 6/2011 | Chaji | .................... | H01L 27/326 345/205 |
| 2013/0050116 A1* | 2/2013 | Shin | ........................ | G06F 3/044 345/173 |
| 2013/0162595 A1* | 6/2013 | Lee | ........................ | G06F 3/0418 345/174 |
| 2014/0049271 A1* | 2/2014 | Trend | ....................... | G06F 3/044 324/663 |
| 2014/0176494 A1* | 6/2014 | Huang | ................. | G02F 1/13338 345/174 |
| 2014/0306867 A1* | 10/2014 | Qing | ..................... | G09G 3/3233 345/76 |

(Continued)

FOREIGN PATENT DOCUMENTS

| KR | 10-2012-0019077 A | 3/2012 |
|---|---|---|
| KR | 10-2016-0027907 A | 3/2016 |

*Primary Examiner* — Nathan Danielsen
(74) *Attorney, Agent, or Firm* — Novick, Kim & Lee, PLLC; Jae Youn Kim

(57) ABSTRACT

A display device includes a substrate including a display area and a touch area overlapping the display area, a plurality of pixels disposed in the display area, and a plurality of touch cells disposed in the touch area and individually driven. At least some of the pixels are disposed on a same layer as at least some of the touch cells.

15 Claims, 13 Drawing Sheets

(56) References Cited

U.S. PATENT DOCUMENTS

| | | | | |
|---|---|---|---|---|
| 2015/0053947 A1* | 2/2015 | Qing | ........................ | G06F 3/044 |
| | | | | 257/40 |
| 2015/0205440 A1* | 7/2015 | Yang | ........................ | G06F 3/044 |
| | | | | 345/174 |
| 2016/0042216 A1* | 2/2016 | Yang | ........................ | G06F 3/044 |
| | | | | 382/124 |
| 2016/0147348 A1* | 5/2016 | Liu | ........................ | G06F 3/0412 |
| | | | | 345/173 |
| 2016/0154515 A1* | 6/2016 | Mu | ........................ | G06F 3/044 |
| | | | | 345/174 |
| 2016/0217733 A1* | 7/2016 | Kim | ........................ | G09G 3/3225 |
| 2017/0115811 A1* | 4/2017 | Yang | ........................ | G06F 3/044 |

* cited by examiner

DISPLAY DEVICE

CROSS-REFERENCE TO RELATED APPLICATION

This U.S. non-provisional patent application claims priority under 35 U.S.C. § 119 of Korean Patent Application No. 10-2017-0074751, filed on Jun. 14, 2017, the contents of which are hereby incorporated by reference in its entirety.

BACKGROUND

1. Field of Disclosure

The present disclosure relates to a display device. More particularly, the present disclosure relates to a display device including a touch sensor installed therein.

2. Description of the Related Art

Electronic devices, such as a mobile phone, a tablet PC, etc., include a display device to display information to a user. In many cases, a touch function is required as an input device to operate the display device.

In general, a capacitive-type touch sensing method is most widely used for a touch sensing function, and a separate touch unit is manufactured and mounted on a display panel. In this case, however, it is disadvantageous both in terms of miniaturization of the display device and in terms of price.

SUMMARY

The present disclosure provides a display device including a touch sensor installed therein, which has superior touch sensitivity, is capable of being miniaturized, and is easily implemented.

Embodiments of the inventive concept provide a display device including a substrate including a display area and a touch area overlapping the display area, a plurality of pixels disposed in the display area, and a plurality of touch cells disposed in the touch area and individually driven. At least some of the pixels are disposed on a same layer as at least some of the touch cells.

Each of the pixels includes a first electrode disposed in the display area, a second electrode spaced apart from the first electrode, a light emitting layer interposed between the first electrode and the second electrode, and a pixel thin film transistor connected to the first electrode.

Each of the touch cells includes a touch electrode disposed in the touch area and a touch thin film transistor connected to the touch electrode.

The second electrode and the touch electrode are spaced apart from each other when viewed in a plan view.

The touch electrode is disposed on a same layer as the first electrode or the second electrode.

At least a portion of the second electrode overlaps at least a portion of the touch electrode.

The second electrode is disposed on a different layer from the touch electrode such that an insulating layer is disposed between the second electrode and the touch electrode.

The display device further includes a dummy electrode disposed to face the touch electrode such that an insulating layer is disposed between the dummy electrode and the touch electrode, and the dummy electrode is floated.

The display device further includes a scan line connected to the pixel thin film transistor, a data line connected to the pixel thin film transistor, a touch driving line connected to the touch thin film transistor, and a touch sensing line connected to the touch thin film transistor.

The display device further includes a scan driver applying a scan signal to the scan line, a data driver applying an image signal to the data line, a first touch controller applying a touch driving signal to the touch driving line, and a second touch controller receiving a touch output signal from the touch sensing line.

Each of the pixel thin film transistor and the touch thin film transistor includes a gate electrode, a source electrode, and a drain electrode, and at least one of the gate electrode, the source electrode, and the drain electrode of the pixel thin film transistor is disposed on a same layer as at least one of the gate electrode, the source electrode, and the drain electrode of the touch thin film transistor.

Each of the touch cells includes a touch electrode electrically connected to a first node, a pre-charge unit electrically connected to the first node and a second node different from the first node to pre-charge the first node and the second node in response to a first signal, a charge redistribution unit electrically connected to the first node and the second node to redistribute charges charged in the first node and the second node in response to a second signal different from the first signal, and a sensing unit electrically connected to the first node to sense a voltage of the first node.

The sensing unit includes a first transistor selectively turned on or turned off in response to the first node and a second transistor connected to the first transistor in series and selectively turned on or turned off in response to a third signal different from the first and second signals.

The pre-charge unit includes a third transistor electrically connected to the first node and selectively turned on or turned off in response to the first signal, a fourth transistor electrically connected to the third transistor in parallel and selectively turned on or turned off in response to the first signal, and a capacitor electrically connected to the second node and the fourth transistor.

The charge redistribution unit includes a fifth transistor electrically connected to the first node and the second node and selectively turned on or turned off in response to the second signal.

According to the above, the display device has a high sensitivity with respect to the touch event by the user. In addition, since the touch sensor is installed in the display device, the size of the display device may be reduced and easily manufactured.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
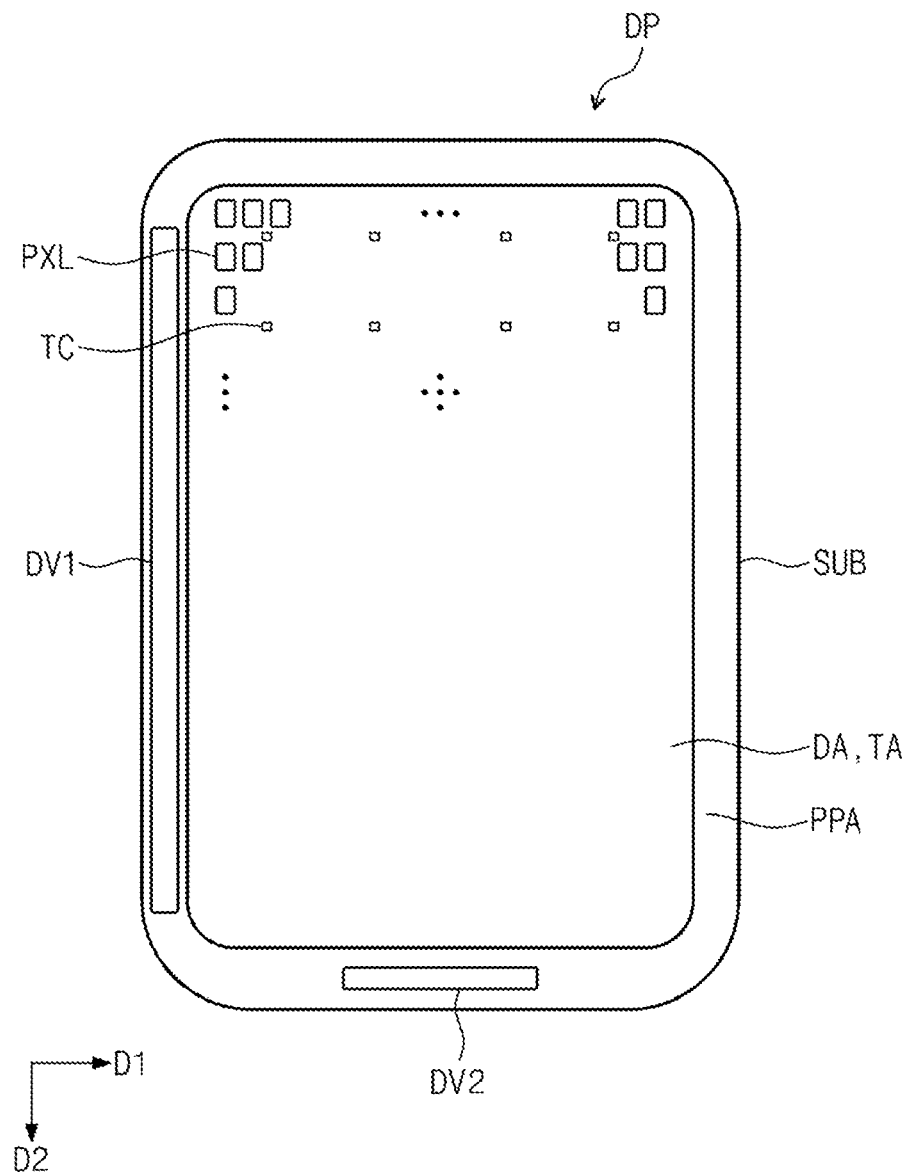
FIG. 1 is a plan view showing a display device according to an exemplary embodiment of the present disclosure.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

Hereinafter, exemplary embodiments of the present disclosure will be explained in detail with reference to the accompanying drawings.

FIG. 1 is a plan view showing a display device DP according to an exemplary embodiment of the present disclosure.

The display device DP according to the exemplary embodiment of the present disclosure displays an image and includes a touch sensor installed therein. The display device DP according to the exemplary embodiment of the present disclosure may be various electronic devices, for example, a mobile phone, a billboard, a personal terminal device, a smart watch, a navigation, a television set, etc., and should not be limited to a specific device as long as the electronic devices are required to display the image and sense a touch event. In the exemplary embodiment of the present disclosure, the mobile phone will be described as the display device DP. However, the display device DP should not be limited thereto or thereby and may be other display devices without departing from the concept of the present disclosure.

The display device DP may have various shapes, and as an example, the display device DP may have a rectangular plate shape with two pairs of sides meeting at right angles. In the case that the display device DP has the rectangular plate shape, one of the two pairs of sides may be longer than the other. In the exemplary embodiment of the present disclosure, for the convenience of explanation, the display device has the rectangular plate shape with a pair of long sides and a pair of short sides.

However, the shape of the display device DP should not be limited to the rectangular plate shape and may have various shapes. As an example, the display device DP may have various shapes, such as a closed polygonal shape having a side of a straight line, a circular or oval shape having a side of a curve, a semi-circular or semi-oval shape having a side of curved and straight lines, etc. In the case that the display device DP includes the side of straight line, at least a portion of corners of each of the shapes may be a curved line. For instance, when the display device DP has the rectangular plate shape, a portion at which two adjacent straight sides make contact with each other may be replaced with a curved line having a predetermined curvature. That is, vertices of the rectangular plate shape may be a curved side having the predetermined curvature, and both ends of the curved side are connected to two straight lines adjacent to each other. The curvature may be set differently depending on the position. As an example, the curvature may vary depending on a position at which the curved line begins and a length of the curved line.

All or at least a portion of the display device DP may have flexibility. As an example, the display device DP may have the flexibility over the whole area thereof or may have the flexibility in an area corresponding to a flexible area.

The display device DP may display an image in a forward direction thereof. The display device DP includes a display area DA in which a pixel PXL is arranged to display the image and a peripheral area PPA disposed at a position adjacent to at least one side of the display area DA. For instance, the peripheral area PPA may be provided to surround the display area DA.

The pixel PXL is provided in a plural number to the display area DA, and the pixels PXL are arranged in a matrix form along a row extending in a first direction D1 and a column extending in a second direction D2. However, the pixels PXL may be arranged in a different way from the above-mentioned arrangement, and in the present exemplary embodiment, the pixels PXL arranged in the row and column directions will be described as a representative example. The pixels PXL are provided in the display area DA of a substrate SUB. Each pixel PXL may be a minimum unit displaying the image. The pixels PXL may include a light emitting element emitting a white light and/or a color light. Each pixel PXL may emit one color of a red color, a green color, and a blue color, but it should not be limited thereto or thereby. That is, each pixel PXL may emit a cyan color, a magenta color, a yellow color, or the like.

The display area DA may have a shape corresponding to the shape of the display device DP. As an example, similar to the shape of the display device DP, the display area DA may have various shapes, such as the closed polygonal shape having the side of the straight line, the circular or oval shape having the side of the curve, the semi-circular or semi-oval shape having the side of curved and straight lines, etc. In the exemplary embodiment of the present disclosure, the display area DA may have the rectangular shape.

The pixels PXL are not provided in the peripheral area PPA, and thus the image is not displayed in the peripheral area PPA. A driving unit that drives the pixels PXL and a line (not shown) that connects the pixels PXL and the driving unit are provided in the peripheral area PPA. The peripheral area PPA corresponds to a bezel of the display device DP after the display device DP is manufactured, and the bezel has a width determined depending on a width of the peripheral area PPA.

The display device DP according to the present exemplary embodiment is provided in a touch sensor integrated type display device. The display device DP includes a touch area TA in which a touch cell TC for the user is provided to sense the touch event and a non-touch area NTA disposed adjacent to at least one side of the touch area TA. In the exemplary embodiment of the present disclosure, the non-touch area NTA has a shape surrounding the touch area TA.

The touch area TA may correspond to the display area DA, and the non-touch area NTA may correspond to the peripheral area PPA. Accordingly, when viewed in a plan view, the touch area TA and the display area DA may overlap each other to correspond to each other, and the non-touch area NTA and the peripheral area PPA may overlap each other to correspond to each other. However, a size and a shape of the touch area TA and the non-touch area NTA should not be limited thereto or thereby. For instance, the touch area TA may extend to a portion of the peripheral area PPA.

The touch cell TC may be provided in a plural number, and the touch cells TC may be arranged in the touch area TC. The touch cells TC may be arranged in a matrix form with rows and columns, but the touch cells TC may be arranged in a different way from the above-described arrangement. In the exemplary embodiment, for the convenience of explanation, the touch cells TC arranged in rows by columns will be described as a representative example.

The number of the touch cells TC may be smaller than that of the pixels PXL. In the exemplary embodiment of the present disclosure, an area of the minimum unit displaying the image may be different from an area of a minimum unit sensing the touch event. This is related to difference in resolution between the pixel PXL and the resolution when the touch event occurs, and the touch cells TC having a smaller number than that of the pixels PXL may correspond to the pixels PXL. In the exemplary embodiment of the present disclosure, the number of the touch cells TC and a distance between the touch cells TC adjacent to each other may be selectively set. As an example, the number of the touch cells TC and the distance between the touch cells TC adjacent to each other may be set appropriately depending on the sensitivity and speed of the touch cell TC. According to the present exemplary embodiment, the distance between the touch cells TC adjacent to each other is set smaller than a minimum resolution power required by a touch controller, and thus the touch cell TC has a higher signal-to-noise ratio than that of a conventional touch sensor.

Figure 2:
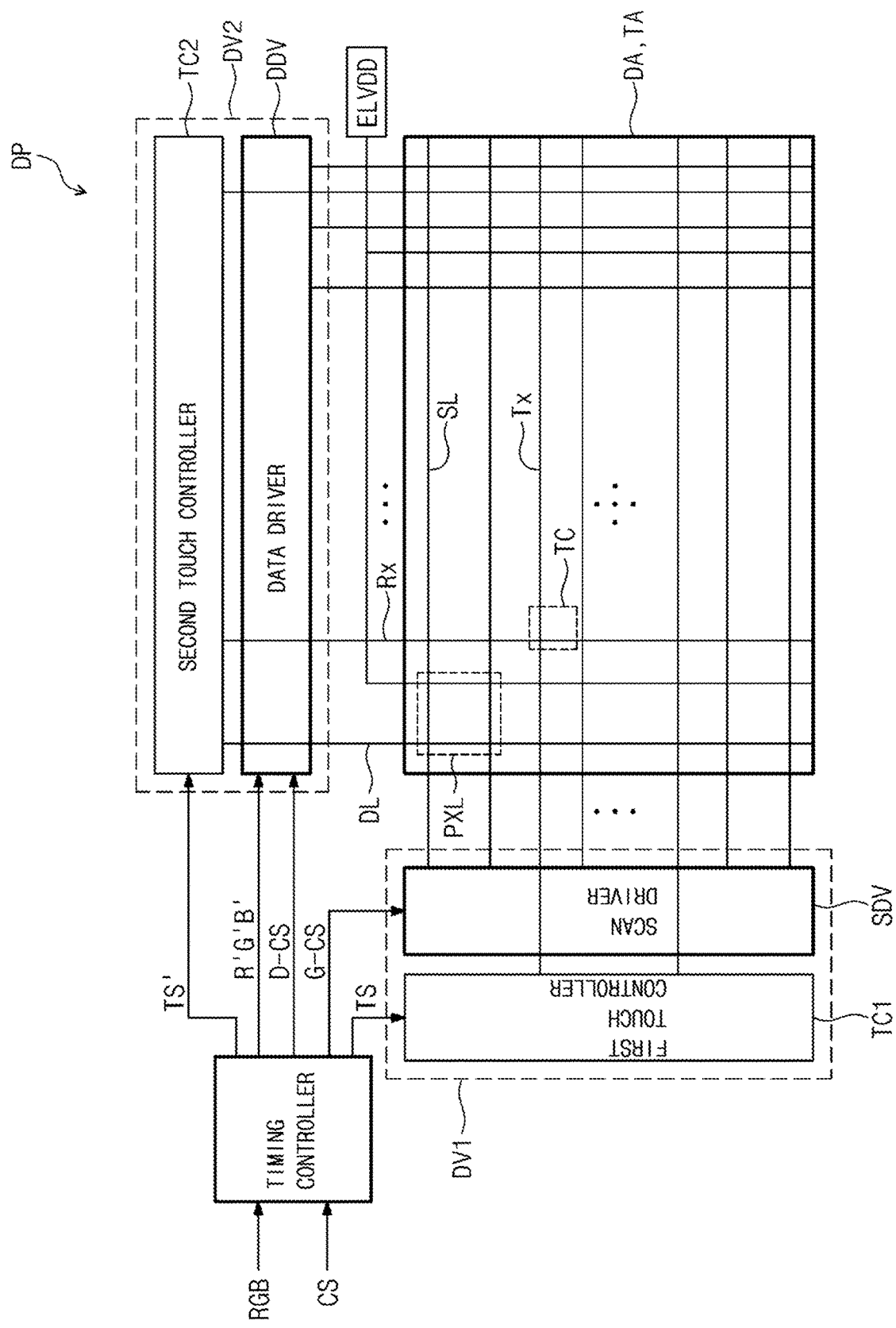
FIG. 2 is a block diagram showing a display device according to an exemplary embodiment of the present disclosure.
Figure 3:
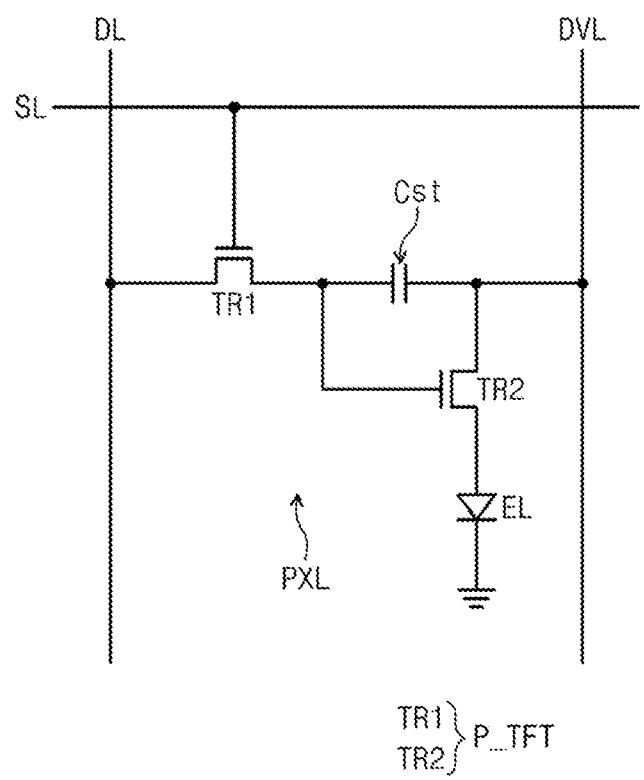
FIG. 3 is a circuit diagram showing one pixel shown in FIG. 2.

FIG. 2 is a block diagram showing the display device DP according to an exemplary embodiment of the present disclosure. FIG. 3 is a circuit diagram showing one pixel shown in FIG. 2.

Referring to FIG. 2, the display device DP includes the pixel PXL displaying the image, the touch cell TC sensing the user's touch, and a driving unit connected to each of the pixel PXL and the touch cell TC to drive the pixel PXL and the touch cell TC.

The driving unit includes a timing controller TCN to control a drive of first and second drivers DV1 and DV2. The first driver DV1 includes a scan driver SDV and a first touch controller TC1, and the second driver DV2 includes a data driver DDV and a second touch controller TC2. In the present exemplary embodiment, the scan driver SDV and the data driver DDV are connected to the pixel PXL to drive the pixel PXL, and the first touch controller TC1 and the second touch controller TC2 are connected to the touch cell TC to drive the touch cell TC.

The pixel PXL is provided in the display area DA in a plural number.

Each of the pixels PXL displays the image and should not be limited to a specific pixel. In the exemplary embodiment of the present disclosure, the pixel PXL may be, but not limited to, a light emitting element.

Referring to FIGS. 2 and 3, each pixel PXL includes a pixel thin film transistor P_TFT connected to a scan line SL, a data line DL, and a driving voltage line DVL, a light emitting element EL connected to the pixel thin film transistor P_TFT, and a capacitor Cst.

The scan line SL extends in one direction, and the data line DL extends in another direction crossing the scan line SL. The driving voltage line DVL extends in substantially the same direction as the data line DL. The scan line SL transmits a scan signal to the pixel thin film transistor P_TFT, the data line DL transmits a data signal to the pixel thin film transistor P_TFT, and the driving voltage line DVL applies a driving voltage to the pixel thin film transistor P_TFT. In the present exemplary embodiment, for the convenience of explanation, the lines are disposed to be parallel to each other or disposed to cross each other, but the directions in which the lines extend may be changed.

The pixel thin film transistor P_TFT may include a driving thin film transistor TR2 to control the light emitting element EL and a switching thin film transistor TR1 to switch the driving thin film transistor TR2. In the exemplary embodiment of the present disclosure, one pixel PXL includes two thin film transistors TR1 and TR2, but the number of the thin film transistors included in one pixel PXL should not be limited to two. That is, one pixel PXL may include one thin film transistor and a capacitor or include three or more thin film transistors and two or more capacitors.

The switching thin film transistor TR1 includes a gate electrode connected to the scan line SL and a source electrode connected to the data line DL. The switching thin film transistor TR1 includes a drain electrode connected to a gate electrode of the driving thin film transistor TR2. The switching thin film transistor TR1 transmits the data signal applied thereto through the data line DL to the driving thin film transistor TR2 in response to the scan signal applied thereto through the scan line SL.

The driving thin film transistor TR2 includes the gate electrode connected to the drain electrode of the switching thin film transistor TR1, a source electrode connected to the driving voltage line DVL, and a drain electrode connected to the light emitting element EL.

The light emitting element EL includes a light emitting layer (not shown), a first electrode (not shown), and a second electrode (not shown) facing the first electrode such that the light emitting layer is disposed between the first and second electrodes. The first electrode is connected to the drain electrode of the driving thin film transistor TR2. The second electrode receives a common voltage, and the light emitting layer emits or does not emit a light in response to an output signal from the driving thin film transistor TR2, thereby displaying the image. In this case, the light emitted from the light emitting layer may be, but not limited to, the white light or the color light.

The capacitor Cst is connected between the gate electrode and the source electrode of the driving thin film transistor TR2 to charge and maintain a voltage corresponding to the data signal applied to the gate electrode of the driving thin film transistor TR2.

The timing controller TCN receives a plurality of image signals RGB and a plurality of control signals CS. The timing controller TCN converts a data format of the image signals RGB into a data format appropriate to an interface between the data driver DDV and the timing controller TCN and provides the converted image signals R'G'B' to the data driver DDV. In addition, the timing controller TCN generates a data control signal D-CS, e.g., an output start signal, a horizontal start signal, etc., and a gate control signal G-CS, e.g., a vertical start signal, a vertical clock signal, a vertical clock bar signal, etc., based on the control signals CS. The data control signal D-CS is applied to the data driver DDV, and the gate control signal G-CS is applied to the scan driver SDV.

The scan driver SDV sequentially outputs scan signals in response to the gate control signal G-CS provided from the timing controller TCN. Accordingly, the pixels PXL may be sequentially scanned in the unit of row by the scan signals.

The data driver DDV converts the image signals R'G'B' to data signals in response to the data control signal D-CS provided from the timing controller TCN and outputs the data signals. The output data signals are applied to the pixels PXL.

Accordingly, each pixel PXL is turned on in response to a corresponding scan signal among the scan signals, and the turned-on pixel PXL receives a corresponding data voltage from the data driver DDV to display the image with desired grayscale.

Referring to FIG. 2 again, the touch cell TC is provided in a plural number in the touch area TA.

Each of the touch cells TC senses the touch event by the user and is connected to the first and second touch controllers TC1 and TC2 of the driving unit.

The touch area TA in which the touch cells TC are provided overlaps the display area DA in which the pixels PXL are provided. The touch cells TC are provided in a number corresponding to the number of the pixels PXL in a one-to-one correspondence, but they should not be limited thereto or thereby. In the exemplary embodiment of the present disclosure, the touch cells TC may be provided in a ratio of several to one pixel PXL. That is, the touch area TA controlled by one touch cell TC may correspond to the display area DA in which the image is displayed by several pixels PXL.

Figure 4:
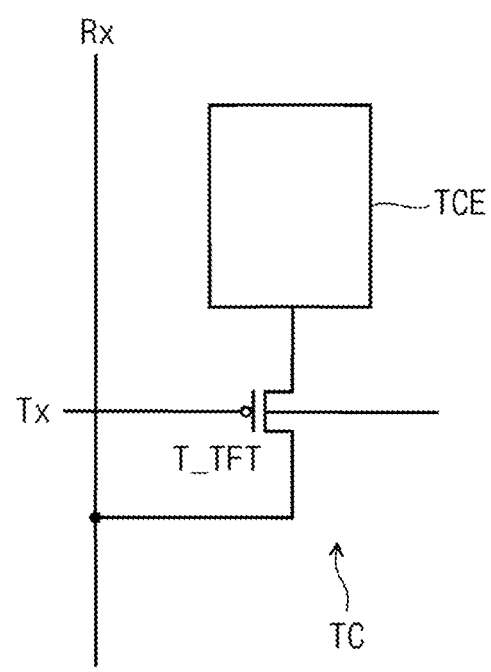
FIG. 4 is a circuit diagram showing one touch cell shown in FIG. 2.

FIG. 4 is a circuit diagram showing one touch cell TC shown in FIG. 2.

For the convenience of explanation, FIG. 4 shows one touch cell TC, but the number of the touch cells TC should not be limited thereto or thereby. That is, plural touch cells TC may be arranged in the display device.

Referring to FIGS. 2 and 4, thin film transistors are respectively connected to the touch cells TC as switching elements, and thus the touch cells TC are individually driven. Each of the touch cells TC includes a touch thin film transistor T_TFT connected to a touch driving line Tx and a touch sensing line Rx and a touch electrode TCE connected to the touch thin film transistor T_TFT. That is, each of the touch cells TC includes the touch thin film transistor T_TFT as its switching element, and thus each of the touch cells TC is driven in an active matrix manner. That is, the touch cell TC connects or disconnects the touch electrode TCE to or from the touch driving line Tx and the touch sensing line Rx through the touch thin film transistor T_TFT that serves as the switching element. Accordingly, a load and an interaction between the lines of each touch cell TC decrease.

The touch driving line Tx extends in one direction. In the exemplary embodiment of the present disclosure, the touch driving line Tx may extend in the same direction as the scan line SL. The touch sensing line Rx extends in another direction crossing the touch driving line Tx. In the exemplary embodiment of the present disclosure, the touch sensing line Rx may extend in the same direction as the data line DL. In the present exemplary embodiment, for the convenience of explanation, the lines are disposed to be parallel to each other or disposed to cross each other, but the directions in which the lines extend may be changed.

The touch electrode TCE corresponds to a capacitor electrode that forms a self-capacitance between itself and a touch tool, e.g., a user's finger, a stylus pen, etc. The capacitance formed by the touch electrode TCE and the touch tool may vary depending on the user's touch.

The touch thin film transistor T_TFT includes a gate electrode connected to the touch driving line Tx, a drain electrode connected to the touch electrode TCE, and a source electrode connected to the touch sensing line Rx. The touch thin film transistor T_TFT is turned on or off in response to a driving signal applied to the touch driving line Tx, and a sensing signal in the touch sensing line Rx is changed depending on the variation of the capacitance of the touch electrode TCE.

In the exemplary embodiment of the present disclosure, one touch cell TC includes one touch thin film transistor T_TFT, but it should not be limited thereto or thereby. That is, one touch cell TC may include two or more touch thin film transistors T_TFT.

The first touch controller TC1 applies a touch driving signal to each touch cell TC through the touch driving line Tx. The second touch controller TC2 receives a variation amount of a touch sensing signal from each touch cell TC through the touch sensing line Rx.

The timing controller TCN provides or receives touch signals TS and TS' to or from the first touch controller TC1 and the second touch controller TC2. The first touch controller TC1 receives the touch signal TS from the timing controller TCN and sequentially outputs the touch driving signal. The second touch controller TC2 outputs the touch sensing signal in response to the touch driving signal and receives the touch sensing signal changed depending on the user's touch.

Although not shown in figures, the touch controller may apply a synchronization signal to the first and second touch controllers TC1 and TC2 to synchronize an operation of the pixels PXL with an operation of the touch cells TC in terms of time. The first and second controllers TC1 and TC2 may control internal operating conditions thereof using the synchronization signal.

In a conventional display device, when the pixels PXL of the display device are disposed close to the touch cells TC, a noise such as a crosstalk may occur between the pixels PXL and the touch cells TC. However, according to the exemplary embodiment of the present disclosure, since the operation condition of the touch cells TC is controlled by the synchronization signal from the touch controller when the pixels PXL are operated, the noise such as the crosstalk may be prevented from occurring.

Accordingly, each touch cell TC is turned on in response to the touch driving signal and receives the corresponding touch sensing signal depending on the touch event by the user to sense whether the touch occurs.

In the exemplary embodiment of the present disclosure, the first driver DV1 includes the first touch controller TC1 and the scan driver SDV, and the second driver DV2 includes the second touch controller TC2 and the data driver DDV, but they should not be limited thereto or thereby. That is, the first and second touch controllers TC1 and TC2 may be separately provided from the scan driver SDV or the data driver DDV. In addition, the first touch controller TC1 and the second touch controller TC2 are provided separate from each other, but they should not be limited thereto or thereby. That is, the first touch controller TC1 and the second touch controller TC2 may be configured in one configuration. That is, a touch driving unit may have various configurations as long as the touch driving unit drives the touch cell TC in the active matrix manner.

In the case of the touch sensor integrated type display device according to the exemplary embodiment of the present disclosure, the number of the lines may be reduced using multiplexing. In addition, the touch sensor integrated type display device according to the exemplary embodiment of the present disclosure may have high precision touch sensitivity when compared with the conventional display device.

When sensing the touch event, it is necessary not only to check whether the touch event occurs but also to accurately track the touch position. In the conventional display device, the touch event and the touch position are sensed by a mutual capacitance type or a self-capacitance type touch sensor. The conventional self-capacitance type touch sensor requires a large number of touch electrodes and a large number of lines connected to the touch electrodes in order to improve sensitivity and accuracy of the touch sensing operation. As an example, in a case that a matrix form of M by N (M×N) touch electrodes is provided, the number of the lines connected to each of the touch electrodes is M by N (M×N), and thus it is disadvantageous to integrate the touch driving unit since a space for the arrangement of the lines is restricted. Accordingly, the number of the touch electrodes is restricted, and it is difficult to improve sensitivity and accuracy of the touch sensing operation.

In the case of the conventional self-capacitance type touch sensor, a plurality of touch electrodes sensing the capacitance and lines connecting the touch electrodes are required, and numerous lines are connected to the touch controller. As a result, the configuration of the conventional touch sensor is complicated, and the sensing efficiency of the conventional touch sensor is degraded. In addition, in the case of the mutual capacitance type touch sensor, the number of the connection lines is reduced compared with the self-capacitance type touch sensor, but similar to the self-capacitance type touch sensor, parasitic components exist between the touch electrode and the touch controller.

According to the exemplary embodiment of the present disclosure, however, the touch sensing operation may be independently performed in one line unit similar to the scanning method. As an example, in the case that the number of the touch electrodes is M by N (M×N), i.e., in the case that the number of the sensing electrodes in a row direction is "M" and the number of the sensing electrodes in a column direction is "N", the "N" sensing signals are provided to the touch driving unit, and only "M" signals that control the "N" sensing signals are required, thereby dramatically reducing the number of the lines. Accordingly, the restriction on the number of the lines and on pins in the touch driving unit, which are caused during integration process for the touch driving unit, may be solved. As a result, since the restriction on the number of the lines is removed, the touch sensing operation may be more precisely performed by increasing the number of the touch sensing electrodes.

In a case of a conventional touch cell, plural parasitic capacitances exist on a path between the touch electrode and a charge amplifier. If a variation in capacitance of a touch sensing unit is small, the parasitic capacitances make an amount of variation in voltage at a rear end of the charge amplifier small, and as a result, a signal-to-noise-ratio (SNR) deteriorates.

The touch cell according to the exemplary embodiment of the present disclosure provides an active charge-to-current control circuit to minimize an effect of this parasitic capacitance. Sensing information is converted into a current by the control circuit and transmitted to a sensing front-end in the touch driving unit, and thus the sensitivity of the touch cell may be prevented from deteriorating due to the parasitic capacitance on the path.

Figure 5:
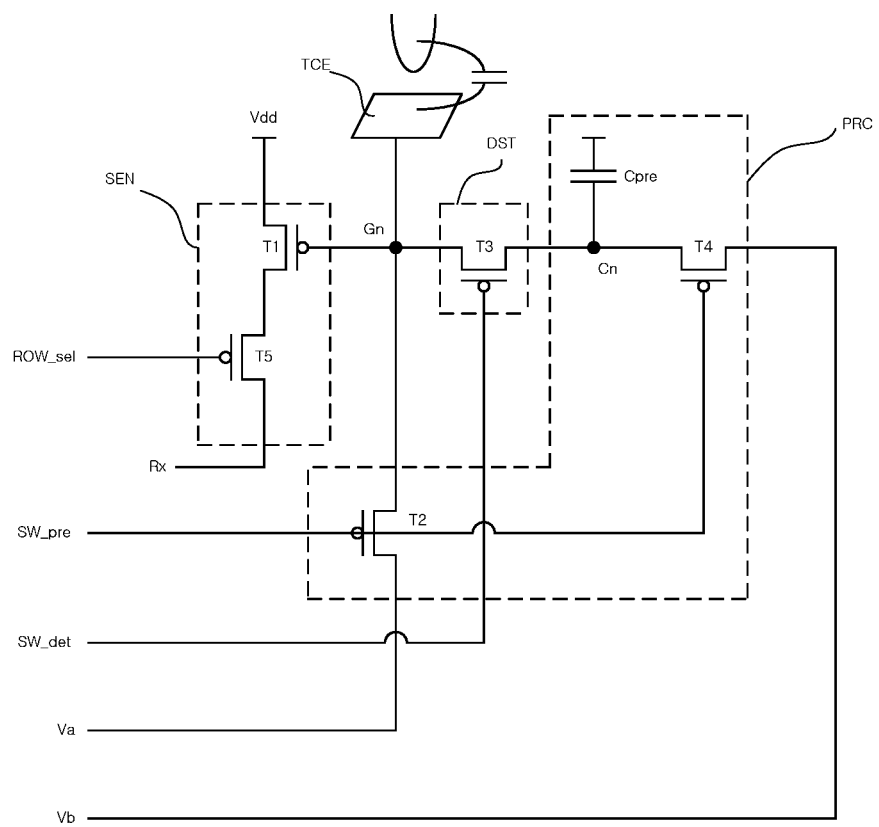
FIGS. 5 and 6 are circuit diagrams showing touch cells according to another exemplary embodiment of the present disclosure.
Figure 6:
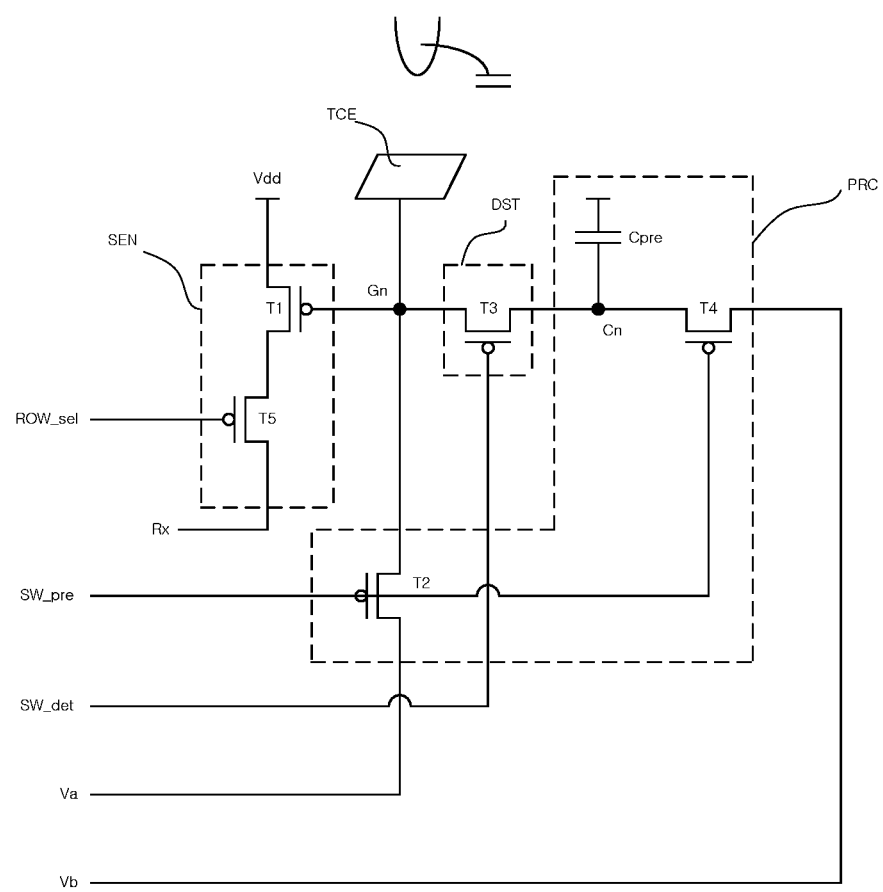
Figure 7:
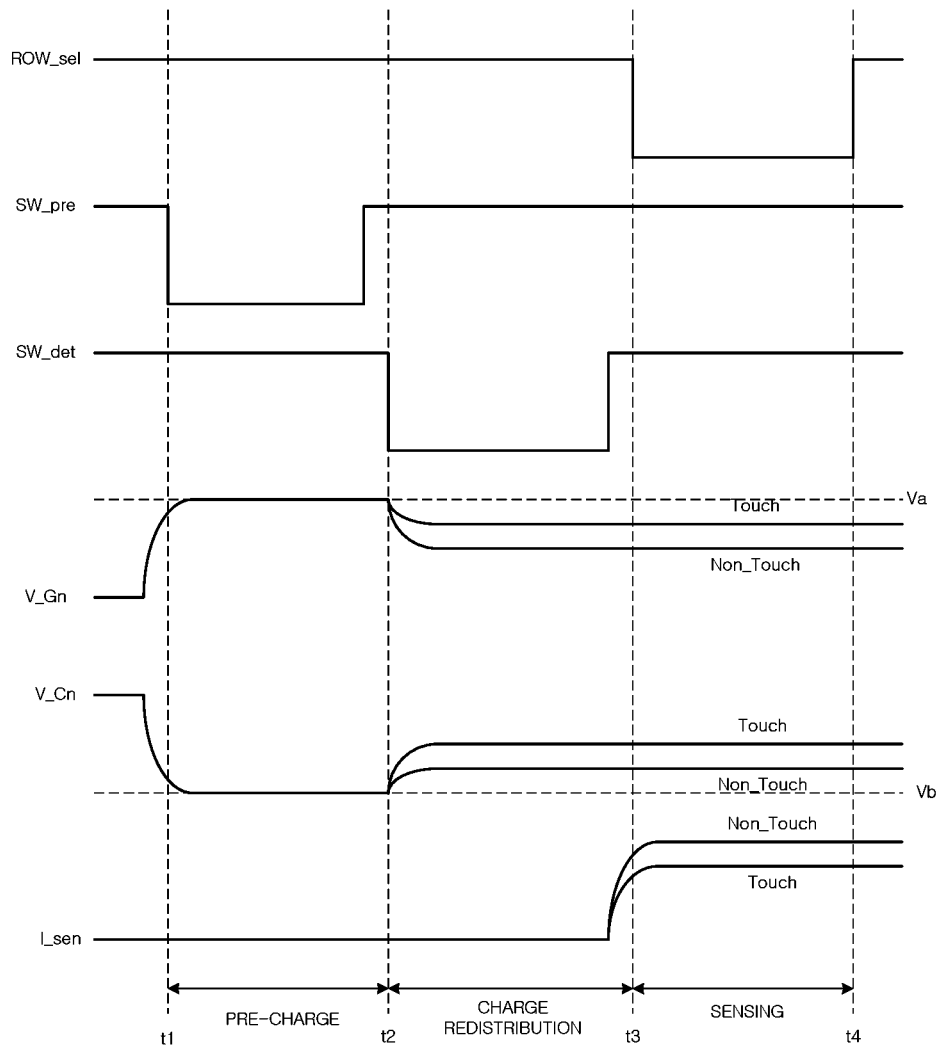
FIG. 7 is a timing diagram explaining an operation of the touch cells shown in FIGS. 5 and 6.

FIGS. 5 and 6 are circuit diagrams showing a touch cell according to another exemplary embodiment of the present disclosure, and FIG. 7 is a timing diagram explaining an operation of the touch cell shown in FIGS. 5 and 6.

Referring to FIGS. 5 to 7, the touch cell according to the exemplary embodiment of the present disclosure includes a touch electrode TCE, a pre-charge unit PRC, a charge redistribution unit DST, and a sensing unit SEN.

The touch electrode TCE forms a capacitor with a person's finger and provides a capacitance with one or more parasitic capacitances existing in a node Gn.

As an example, when a touch event occurs, the capacitance is formed between the touch electrode TCE and the finger as shown in FIG. 5. When the touch event does not occur, the capacitance is not formed between the touch electrode TCE and the finger as shown in FIG. 6. When assuming that a difference in capacitance between the case in which the touch event occurs and the case in which the touch event does not occur is "Cs", the touch cell according to the exemplary embodiment of the present disclosure may sense a current corresponding to the capacitance difference Cs, and thus the touch cell may provide more precise touch sensitivity.

The pre-charge unit PRC charges nodes Gn and Cn to a predetermined voltage during a pre-charge period. The pre-charge unit PRC includes a second transistor T2, a fourth transistor T4, and a capacitor Cpre.

Gates of the second and fourth transistors T2 and T4 are turned on or off in response to a signal SW_pre. A drain and a source of the second transistor T2 are respectively connected to the node Gn and a supply voltage Va. A drain and a source of the fourth transistor T4 are respectively connected to the node Cn and a supply voltage Vb.

As an example, in the case that the second and fourth transistors T2 and T4 are turned on in response to the signal SW_pre, the pre-charge unit PRC charges the nodes Gn and Cn to the supply voltages Va and Vb, respectively.

The charge redistribution unit DST redistributes charges charged in the nodes Gn and Cn. The charge redistribution unit DST includes a third transistor T3. The third transistor T3 is turned on or off in response to a signal SW_det applied to a gate thereof. A drain and a source of the third transistor T3 are respectively connected to the nodes Cn and Gn.

As an example, in the case that the third transistor T3 is turned on in response to the signal SW_det, the node Gn and the node Cn are electrically connected to each other, and thus the operation for the redistribution of the charges may be performed.

The sensing unit SEN performs an operation of indicating a capacitance variation caused when the touch event occurs as a current variation. The sensing unit SEN includes a first transistor T1 and a fifth transistor T5, which are connected to each other in series.

The first transistor T1 is turned on or off in response to the node Gn to which a gate of the first transistor T1 is connected, and the fifth transistor T5 is turned on or off in response to a signal ROW_sel applied to a gate of the fifth transistor T5.

As an example, in the case that the fifth transistor T5 is turned on in response to the signal ROW_sel, a current receiving unit connected to the touch sensing line Rx may sense a current I_sen flowing through the first transistor T1. FIG. 7 is a timing diagram explaining an operation of the touch cell shown in FIGS. 5 and 6. Hereinafter, the operation of the touch cell according to the exemplary embodiment of the present disclosure will be described in detail with reference to FIGS. 5 to 7.

When the signal SW_pre is transited to a low from a high at a time point t1, the pre-charge operation is performed. In this case, the second transistor T2 is turned on, and the node Gn is charged with the supply voltage Va. In this case, an amount of charges charged in the node Gn is obtained by the following equation of $(Cs+Cp)*Va$ when the touch event is sensed and obtained by the following equation of $(Cp)*Vs$ when the touch event is not sensed.

In a case that only the node Gn is charged or discharged, the voltage at the node Gn when the touch event occurs and the voltage at the node Gn when no touch event occurs are the supply voltage Va, and thus the variation in current flowing through the first transistor T1 is not caused. Accordingly, the pre-charge unit PRC further includes the fourth transistor T4 to sense a variation in amount of the charges, which is caused by the touch event.

In detail, when the signal SW_pre is transited to the low from the high during the pre-charge period, the fourth transistor T4 is turned on. Accordingly, the node Cn is pre-charged to the supply voltage Vb. In this case, the capacitor Cpre is charged with a fixed charge of $CpreE*Vb$.

Meanwhile, after the pre-charge operation with respect to the node Gn and the node Cn is completed, the second and fourth transistors T2 and T4 are turned off, and the charges charged in the node Gn and the node Cn are maintained.

When the signal SW_det is transited to the low from the high at a time point t2, the charge redistribution operation is performed. In this case, the third transistor T3 is turned on, and the node Gn is electrically connected to the node Cn. Accordingly, the charges charged in the node Gn and the node Cn are redistributed.

When assuming that a voltage commonly corresponding to the node Gn and the node Cn after the charge redistribution operation is completed is "Vsen", a voltage level of the voltage Vsen is obtained by the following equation of $\{(Cp+Cs)*Va+Cpre*Vb\}/(Cp+Cs+Cpre)$. In a case that Cp+Cpre is sufficiently greater than Cs, the voltage Vsen is obtained by the following equation of $(Cp*Va+Cpre*Vb)/(Cp+Cpre)+Cs*Va/(Cp+Cpre)$.

Here, $(Cp*Va+Cpre*Vb)/(Cp+Cpre)$ corresponds to an offset voltage and has a constant value regardless of the occurrence of the touch event. $Cs*Va/(Cp+Cpre)$ corresponds to the capacitance variation caused by the touch operation.

Meanwhile, the capacitor Cpre may be a capacitor that is artificially provided to generate a desired current value or a parasitic capacitance generated when the cell is formed.

When the signal ROW_sel is transited to the low from the high at a time point t3, the sensing operation starts. In this case, the fifth transistor T5 is turned on, and the current flowing through the first transistor T1 may be sensed by the current receiving unit connected to the touch sensing line Rx.

As an example, when assuming that the current flowing through the first transistor T1 is "I_sen", the current I_sen flowing through the first transistor T1 is 0 A while the fifth transistor T5 is turned off. As another example, when the fifth transistor T5 is turned on, the current I_sen is changed depending on device characteristics of the first transistor T1 and the above-mentioned voltage variation.

Meanwhile, the current receiving unit connected to each column converts the current to the voltage using a current comparator or a trans-impedance amplifier to obtain touch information.

In more detail, the sensed current I_sen is applied to the second touch controller TC2 through the touch sensing line Rx as shown in FIG. 2. The sensed current I_sen passes through parasitic components in the path through which the sensed current I_sen is applied to the second touch controller TC2.

The second touch controller TC2 may include a current-to-voltage converter that converts the sensed current to the voltage or an integrator that accumulates the current to obtain the touch information, which is installed inside the second touch controller TC2. In addition, an analog filter may be connected to rear ends of the above-mentioned circuits, and the analog filter may selectively filter external noises entering thereto with the touch signal. Then, the touch signal may be converted to digital data by an analog-to-digital converter connected to each touch sensing line Rx in the second touch controller TC2, and the digital data are used as input data to extract precise coordinates.

In an in-cell structure as shown in FIG. 2, due to interference with internal signals for display and parasitic components, it is difficult to keep the sensing signal from the touch cell to the inside of the touch controller with maximized SNR.

Accordingly, as shown in FIG. 5, the transistors vertical to the touch cell and applied to an auxiliary circuit, e.g., the pre-charge unit PRC, the charge redistribution unit DST, etc., and/or the sensing circuit SEN may be implemented by using a low-temperature polycrystalline silicon (LTPS) thin film transistor that is used to implement the pixel in the exemplary embodiment of the present disclosure, and thus the sensitivity of the touch signal may be prevented from deteriorating due to the parasitic components on the path between the touch cell and the second touch controller TC2.

The parasitic components include a series resistor and a parallel capacitor between a line and a ground. According to the exemplary embodiment of the present disclosure, the sensed current is fully applied to the second touch controller TC2 without being attenuated by the parasitic components, and no signal attenuation occurs. In a case that the charges are transmitted to the touch controller from the touch cell as the conventional method, the signal is attenuated by the parasitic capacitance components, and as a result, it is impossible to accurately sense the touch event.

Figure 8:
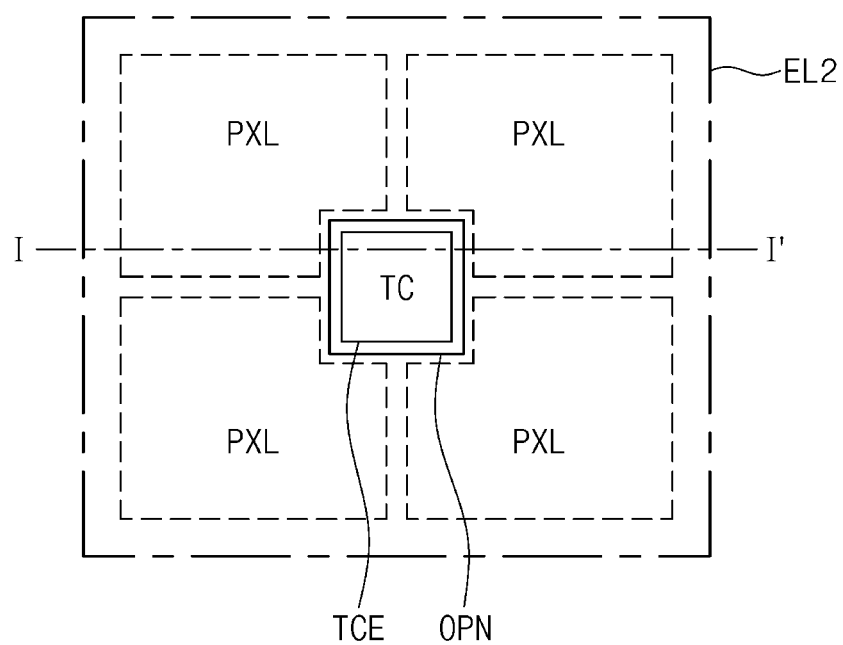
FIG. 8 is a plan view showing a relation between a touch cell and pixels adjacent to the touch cell when a display device provided with a touch sensor installed therein is implemented according to the above-described exemplary embodiments of the present disclosure.
Figure 9:
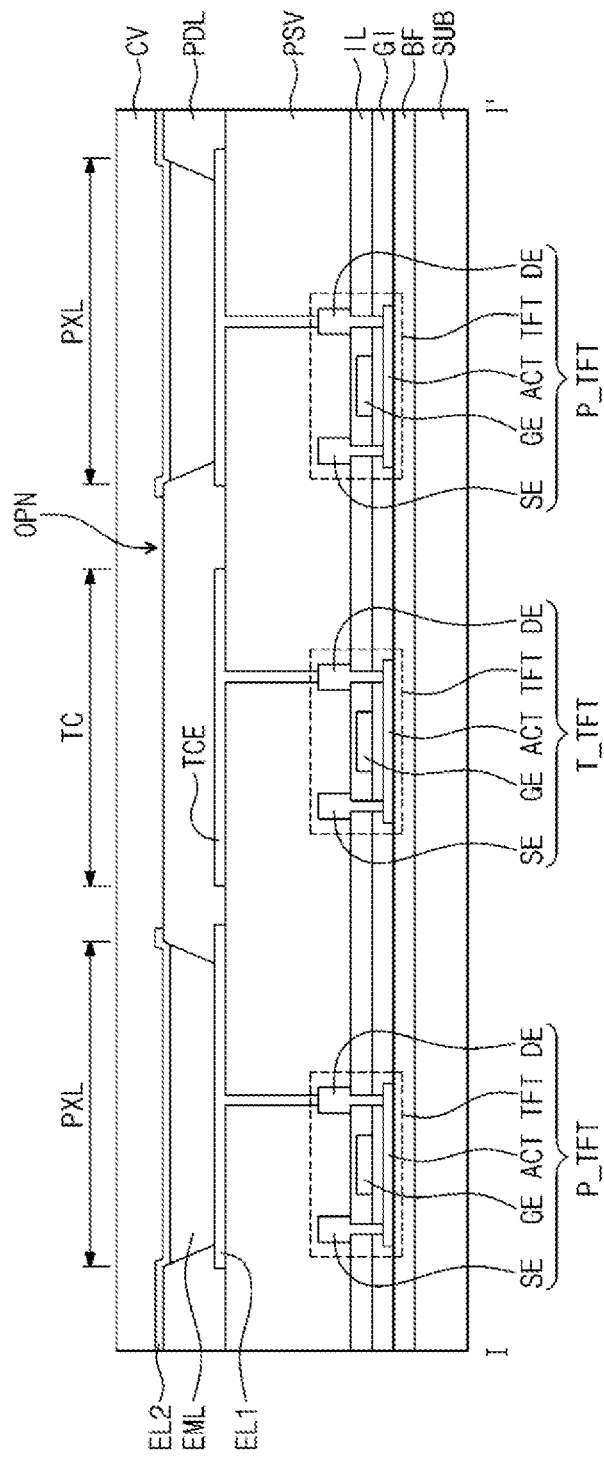
FIG. 9 is a cross-sectional view taken along a line I-I' of FIG. 8.

FIG. 8 is a plan view showing a relation between the touch cell and the pixels adjacent to the touch cell when the display device provided with the touch sensor installed therein is implemented according to the above-described exemplary embodiments of the present disclosure. FIG. 9 is a cross-sectional view taken along a line I-I' of FIG. 8.

In the display device according to the exemplary embodiment of the present disclosure, at least some components of the pixels and the touch cells are disposed on a substrate, and thus a process of assembling or attaching the touch sensor manufactured by a separate process is omitted. That is, the pixels and the touch cells may be substantially simultaneously or individually manufactured on the same substrate. As an example, the pixels and the touch cells may be formed on the substrate through the same process. Accordingly, separate additional processes are not required to form the touch sensor in the exemplary embodiment of the present disclosure, and the touch sensor may be substantially simultaneously formed with the pixels when the pixels are manufactured. Hereinafter, the touch cells and the pixels will be described in detail with reference to accompanying drawings.

Referring to FIGS. 8 and 9, the touch cells according to the exemplary embodiment of the present disclosure are provided between the pixels arranged in a matrix form when viewed in a plan view.

The touch cells according to the exemplary embodiment of the present disclosure may be provided between the pixels to corresponding to plural pixels. For the convenience of explanation, FIG. 8 shows four pixels and one touch cell disposed between the four pixels, but they should not be limited thereto or thereby. In addition, the touch cell is disposed at a position corresponding to corners of the four adjacent pixels, which face each other, but the position of the touch cell should not be limited thereto or thereby. In the exemplary embodiment of the present disclosure, the touch cell has a quadrangular shape, but the shape of the touch cell should not be limited to the quadrangular shape. That is, the touch cell may have various shapes, e.g., a polygonal shape including a triangular shape, a circular shape, an oval shape, etc. In addition, the touch cell has a size smaller than a size of the pixels, but it should not be limited thereto or thereby. That is, the size of the touch cell may be set in various ways as long as the touch event is sensed.

Hereinafter, structures of the touch cell and the pixel will be described in detail with reference to FIGS. 8 and 9.

The display device according to the exemplary embodiment of the present disclosure includes the substrate SUB, the pixel PXL disposed on the substrate SUB, and the touch cell TC disposed on the substrate SUB.

The pixel PXL includes the pixel thin film transistor P_TFT and the light emitting element connected to the pixel thin film transistor P_TFT. The touch cell TC includes the touch thin film transistor T_TFT disposed on the substrate SUB and the touch electrode TCE connected to the touch thin film transistor T_TFT. In the cross-sectional view shown in FIG. 9, each of the pixel PXL and the touch cell TC may include a plurality of thin film transistors, but for the convenience of explanation, one thin film transistor is shown in each of the pixel PXL and the touch cell TC as a representative example. In the case that each of the pixel PXL and the touch cell TC includes plural thin film transistors, each thin film transistor may be provided in a similar fashion to that shown in FIG. 9, and the transistors may be connected to each other using a separate wire or a bridge.

The substrate SUB may include an insulating material, such as a glass, a resin, etc. In addition, the substrate SUB may include a material having flexibility to be curved or folded and have a single or multi-layer structure.

As an example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and polyurethane. However, the material for the substrate SUB should not be limited to the above-mentioned materials, and the substrate SUB may include a fiber reinforced plastic (FRP).

A buffer layer BF is disposed on the substrate SUB. The buffer layer BF prevents impurities from being diffused to switching and driving transistors. The buffer layer BF may have a single-layer structure, or according to embodiments, the buffer layer BF may have a structure of two or more layers.

The buffer layer BF may be, but not limited to, an inorganic insulating layer including an inorganic material. As an example, the buffer layer BF may include silicon nitride, silicon oxide, silicon oxynitride, or the like. In the case that the buffer layer has the multi-layer structure, the layers may have the same material as or different materials from each other. The buffer layer BF may be omitted depending on the material of the substrate SUB and a process condition.

The pixel thin film transistor P_TFT and the touch thin film transistor T_TFT are disposed on the buffer layer BF. Each of the pixel thin film transistor P_TFT and the touch thin film transistor T_TFT includes an active pattern ACT, a gate electrode GE, a source electrode SE, and a drain electrode DE.

First, the active pattern ACT of each of the pixel thin film transistor P_TFT and the touch thin film transistor T_TFT is provided on the buffer layer BF. The active pattern ACT includes a semiconductor material. The active pattern ACT include a source area, a drain area, and a channel area defined between the source area and the drain area. The active pattern ACT may be a semiconductor pattern including a polysilicon, an amorphous silicon, an oxide semiconductor, or the like. The channel area may correspond to a semiconductor pattern that is not doped with any impurity and may be an intrinsic semiconductor. Each of the source area and the drain area may be a semiconductor pattern doped with an impurity. As the impurity, various impurities, e.g., an n-type impurity, a p-type impurity, or an impurity like a metal, may be used.

A gate insulating layer GI is disposed on the active pattern ACT. The gate insulating layer GI may be an inorganic insulating layer including an inorganic material or an organic insulating layer including an organic material. Various materials, such as polysiloxane, silicon nitride, silicon oxide, silicon oxynitride, etc., may be used as the inorganic material. Various materials, such as a polyacryl-based compound, a polyimide-based compound, a fluorine-based carbon compound such as Teflon®, a benzocyclobutene compound, and so forth, may be used as the organic material.

The gate electrode GE is disposed on the gate insulating layer GI. The gate electrode GE is disposed to cover an area corresponding to the channel area of the active pattern ACT.

The gate electrode GE may include a metal material. As an example, the gate electrode GE may include at least one of metal materials, such as gold (Au), silver (Ag), aluminum (Al), molybdenum (Mo), chromium (Cr), titanium (Ti), nickel (Ni), neodymium (Nd), copper (Cu), etc., or an alloy of the metal materials. In addition, the gate electrode GE may have a single-layer structure, but it should not be limited thereto or thereby. That is, the gate electrode GE may have a multi-layer structure in which two or more materials of the metal materials and the alloys are stacked one on another.

In the exemplary embodiment of the present disclosure, although not shown in figures, other lines, such as the scan lines, the touch driving lines, etc., may be provided on the same layer as and may include the same material as the gate electrode GE. Here, other lines, such as the scan lines, the touch driving lines, etc., may be directly or indirectly connected to a portion, i.e., the gate electrode GE, of the thin film transistor of each of the pixel PXL and the touch cell TC.

An inter-insulating layer IL is disposed on the gate electrode GE. The inter-insulating layer IL may be, but not limited to, an inorganic insulating layer including an inorganic material. As the inorganic material, polysiloxane, silicon nitride, silicon oxide, silicon oxynitride, or the like may be used. However, the material of the inter-insulating layer IL should not be limited thereto or thereby, and the inter-insulating layer IL may include an organic material or an organic/inorganic material.

The source electrode SE and the drain electrode DE are disposed on the inter-insulating layer IL. The source electrode SE and the drain electrode DE respectively make contact with the source area and the drain area of the active pattern ACT through contact holes defined through the inter-insulating layer IL and the gate insulating layer GI.

The source electrode SE and the drain electrode DE may include a metal material. As an example, the source electrode SE and the drain electrode DE may include at least one of metal materials, such as gold (Au), silver (Ag), aluminum (Al), molybdenum (Mo), chromium (Cr), titanium (Ti), nickel (Ni), neodymium (Nd), copper (Cu), etc., or an alloy of the metal materials. In addition, the source electrode SE and the drain electrode DE may have a single-layer structure, but it should not be limited thereto or thereby. That is, the source electrode SE and the drain electrode DE may have a multi-layer structure in which two or more materials of the metal materials and the alloys are stacked one on another.

In the exemplary embodiment of the present disclosure, although not shown in figures, the data lines DL, the touch sensing lines, and power lines may be provided on the same layer as and may include the same material as the source electrode SE and the drain electrode DE. In this case, the data lines DL, the touch sensing lines, and the power lines may be directly or indirectly connected to a portion, i.e., the source electrode SE and the drain electrode DE, of the thin film transistor of each of the pixel PXL and the touch cell TC.

A passivation layer PSV is disposed on the source electrode SE and the drain electrode DE. The passivation layer PSV may be, but not limited to, an inorganic insulating layer including an inorganic material. As the inorganic material, polysiloxane, silicon nitride, silicon oxide, silicon oxynitride, or the like may be used. As another example, the passivation layer PSV may be, but not limited to, an organic insulating layer including an organic material. Various materials, such as a polyacryl-based compound, a polyimide-based compound, a fluorine-based carbon compound such as Teflon®, a benzocyclobutene compound, and so forth, may be used as the organic material.

The light emitting element and the touch electrode TCE are disposed on the passivation layer PSV. The light emitting element is disposed in an area in which the pixel PXL is arranged, and the touch electrode TCE is disposed in an area in which the touch cell is arranged. The light emitting element includes a first electrode EL1, a light emitting layer EML, and a second electrode EL2, which are sequentially stacked.

In more detail, the first electrode EL1 and the touch electrode TCE of the light emitting element may be disposed on the passivation layer PSV.

The first electrode EL1 is connected to the drain electrode DE of the pixel thin film transistor P_TFT through a contact hole defined through the passivation layer PSV.

The touch electrode TCE is disposed on the same layer, i.e., on the passivation layer PSV, as the first electrode EL1 and connected to the drain electrode DE of the touch thin film transistor T_TFT through a contact hole defined through the passivation layer PSV. The touch electrode TCE is spaced apart from the first electrode EL1 by a predetermined distance.

According to an embodiment, the first electrode EL1 may be used as an anode or a cathode.

The first electrode EL1 and/or the touch electrode TCE may include a metal layer of Ag, Mg, Al, Pt, Pd, Au, Ni, Nd, Ir, Cr, or an alloy thereof and/or indium tin oxide (ITO), indium zinc oxide (IZO), zinc oxide (ZnO), or indium tin zinc oxide (ITZO).

In the exemplary embodiment of the present disclosure, the first electrode EL1 and/or the touch electrode TCE may include one kind of metal, but it should not be limited thereto or thereby. That is, the first electrode EL1 and/or the touch electrode TCE may include two or more kind of metals, e.g., an alloy of Ag and Mg.

The first electrode EL1 may be a transparent conductive layer when the image is displayed in a downward direction from the substrate SUB, and the first electrode EL1 may be a metal reflective layer and/or a transparent conductive layer when the image is displayed in an upward direction from the substrate SUB.

A pixel definition layer PDL is disposed on the substrate SUB, on which the first electrode EL1 and the touch electrode TCE are disposed, to divide the display area into areas respectively corresponding to the pixels PXL. The pixel definition layer PXL may be disposed in an area in which the touch cell TC is disposed, i.e., on the touch electrode TCE. However, a shape of the pixel definition layer PDL should not be limited thereto or thereby, and the pixel definition layer PXL may not be disposed on the touch electrode TCE.

The pixel definition layer PDL may be, but not limited to, an organic insulating layer including an organic material. Various materials, such as a polyacryl-based compound, a polyimide-based compound, a fluorine-based carbon compound such as Teflon®, a benzocyclobutene compound, and so forth, may be used as the organic material.

The pixel definition layer PDL exposes an upper surface of the first electrode EL1 and protrudes from the substrate SUB along a circumference of the pixel PXL.

The light emitting layer EML may be disposed in the display area DA surrounded by the pixel definition layer PDL. The light emitting layer EML is not provided to the touch cell TC.

The light emitting layer EML may include a low molecular weight or high molecular weight material. The light emitting layer EML may include copier phthalocyanine (CuPc), N,N'-Di(naphthalene-1)-N,N'-diphenyl-benzidine (NPB), or tris-8-hydroxyquinoline aluminum (Alq3) as the low molecular weight material. These materials may be formed by a vacuum deposition method. The light emitting layer EML may include poly-(2,4)-ethylene-dihydroxy thiophene (PEDOT), poly-phenylenevinylene (PPV), or polyfluorene (PFO) as the high molecular weight material.

The light emitting layer EML, may have a single-layer structure. However, according to another embodiment, the light emitting layer EML may have a multi-layer structure of various functional layers. In the case that the light emitting layer EML has the multi-layer structure, the light emitting layer EML may include a hole injection layer, a hole transport layer, an emits layer, an electron transport layer, and an electron injection layer, each of which has the single or multi-layer structure. The light emitting layer EML may be formed by an evaporation method, a screen printing method, an inkjet printing method, a laser induced thermal imaging method, or the like.

The light emitting layer EML should not be limited thereto or thereby and may have various structures. In addition, at least a portion of the light emitting layer EML may be integrally formed over plural first electrodes EL1 as a signal unit or provided in a plurality of portions to respectively correspond to a plurality of first electrodes EL1.

The second electrode EL2 is disposed on the light emitting layer EML. The second electrode EL2 may be provided at every pixel PXL, however, the second electrode EL2 may be provided to cover most of the display area DA, and thus the second electrode EL2 be shared by the pixels PXL.

The second electrode EL2 is disposed in an area except for the area in which the touch cell TC is disposed. That is, the second electrode EL2 covers substantially an entire of the display area, and an area corresponding to the area in which the touch cell TC is disposed is opened. An opening OPN corresponds to the area in which the touch electrode TCE is disposed when viewed in a plan view. Since the touch electrode TCE serves as a capacitor electrode that forms the capacitance with a touch object, e.g., the user, the touch tool such as the stylus pen, etc., it is preferable not to dispose additional electrode between the touch object and the touch electrode TCE. Accordingly, the second electrode EL2 is disposed in the area except for the area in which the touch electrode TCE is disposed when viewed in a plan view.

The second electrode EL2 may be used as an anode or a cathode according to embodiments. When the first electrode EL1 is the anode, the second electrode EL2 serves as the cathode, and when the first electrode EL1 is the cathode, the second electrode EL2 serves as the anode.

The second electrode EL2 may include a metal layer of Ag, Mg, Al, Pt, Pd, Au, Ni, Nd, Ir, Cr, or an alloy thereof and/or a transparent conductive layer of indium tin oxide (ITO), indium zinc oxide (IZO), zinc oxide (ZnO), or indium tin zinc oxide (ITZO). In the exemplary embodiment of the present disclosure, the second electrode EL2 may have a multi-layer structure of two or more layers including a metal thin layer, e.g., a three-layer structure of ITO/Ag/ITO.

The second electrode EL2 may be a metal reflective layer and/or a transparent conductive layer when the image is displayed in a downward direction from the substrate SUB, and the second electrode EL2 may be a transparent conductive layer when the image is displayed in an upward direction from the substrate SUB.

A sealing layer disposed on an entire surface of the substrate SUB in which the sic and electrode EL2 is disposed. The sealing layer SL may have a single-layer structure or a multi-layer structure.

In the exemplary embodiment of the present disclosure, the sealing layer SL may include an organic material and/or an inorganic material. In the exemplary embodiment of the present disclosure, the term of "sealing layer (SL)" indicates not only a sealing layer that has a thin film form but also a sealing layer that is provided on the pixel PXL and the touch cell TC with a substrate form. In the exemplary embodiment of the present disclosure, the sealing layer SL may be separately implemented in the substrate form rather than the thin film form. The sealing layer SL isolates the light emitting element from an external environment and prevents moisture and oxygen from entering the light emitting element. The sealing layer SL may be provided on the pixel in an insulating substrate form formed of glass or polymer resin or a thin film shape in which an organic layer and/or an inorganic layer are/is stacked.

In the exemplary embodiment of the present disclosure, various organic insulating materials, such as a polyacryl-based compound, a polyimide-based compound, a fluorine-based carbon compound such as Teflon®, a benzocyclobutene compound, and so forth, may be used as the organic material. Various materials, such as polysiloxane, silicon nitride, silicon oxide, silicon oxynitride, etc., may be used as the inorganic material.

In the exemplary embodiment of the present disclosure, the light emitting layer EML of the light emitting element may be easily damaged by the moisture or oxygen from the outside of the light emitting layer EML. The sealing layer SL covers the light emitting layer EML to protect the light emitting layer EML from the moisture or oxygen. The sealing layer may extend to the outside of the display area while covering the display area.

As described above, the touch sensor integrated type display device according to the exemplary embodiment of the present disclosure employs the active matrix type touch sensor, and thus the sensitivity of the touch sensor may significantly increase. Since the touch cells of the touch sensor are formed together with the pixels when the pixels are manufactured, the process of assembling or attaching the touch sensor manufactured by the separate process is omitted, and thus a thickness of the touch sensor integrated type display device decreases. In addition, since the separate manufacturing process of the touch sensor is omitted, a manufacturing process of the touch sensor integrated type display device is simplified, and a manufacturing cost of the touch sensor integrated type display device is reduced.

In the touch sensor integrated type display device according to the exemplary embodiment of the present disclosure, the touch sensor may employ various structures besides the above-described structure. In exemplary embodiments described below, different features from those of the above-described embodiments will be mainly described in order to avoid redundancy.

Figure 10:
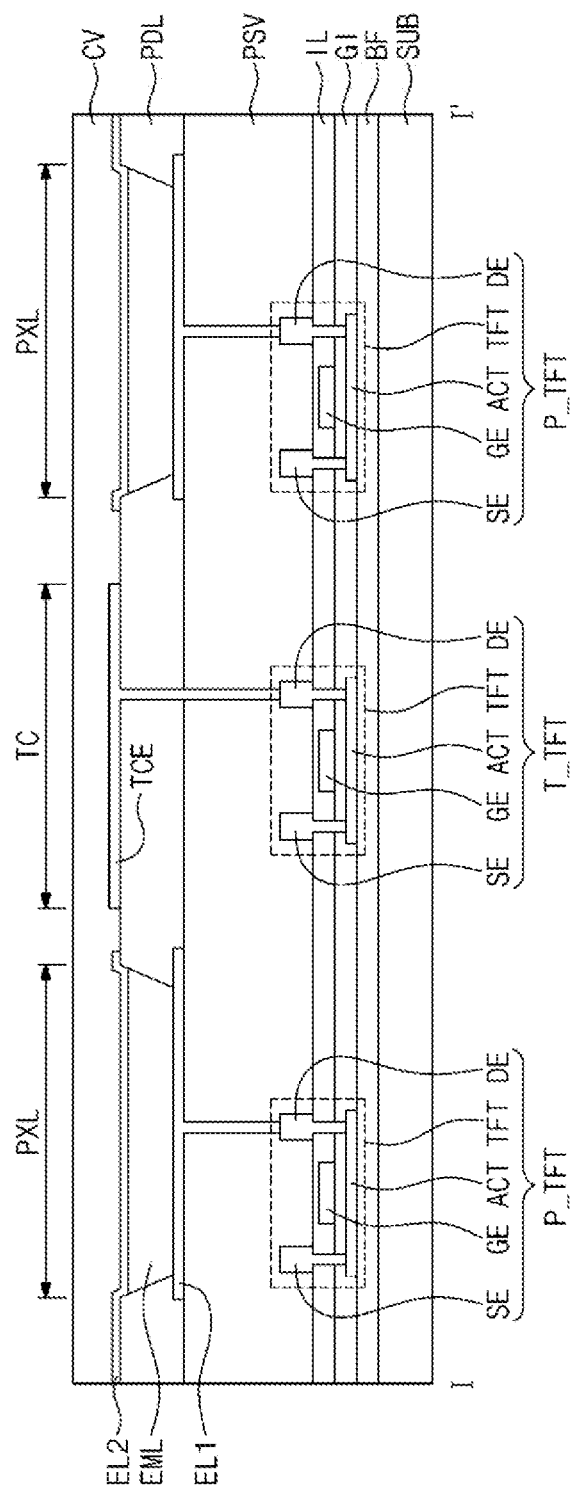
FIG. 10 is a cross-sectional view showing a display device according to another exemplary embodiment of the present disclosure, which corresponds to the line I-I' of FIG. 8.

FIG. 10 is a cross-sectional view showing a display device according to another exemplary embodiment of the present disclosure, which corresponds to the line I-I' of FIG. 8.

Referring to FIG. 10, a touch electrode TCE of a touch cell may be manufactured through the same process as a second electrode EL2 rather than a first electrode EL1. That is, the touch electrode TCE may be provided on a pixel definition layer PDL without being provided on a passivation layer PSV.

When viewed in a plan view, the second electrode EL2 has an opening in an area in which the touch electrode TCE is disposed, and the touch electrode TCE is disposed in the opening. In the present exemplary embodiment, in the case that the touch event occurs by the user, since a distance between the touch tool, e.g., the user's finger, the stylus pen, etc., and the touch electrode TCE is smaller than that in the above-mentioned embodiment and a disturbance caused by the second electrode EL2 becomes smaller, a variation in capacitance is greater than that of the above-mentioned embodiment. Accordingly, the variation in capacitance between the touch tool and the touch electrode TCE may be easily sensed.

In the present exemplary embodiment, the touch electrode TCE makes direct contact with a drain electrode DE of a touch thin film transistor T_TFT through a contact hole, however, this is just for the convenience of explanation. That is, an additional contact hole(s) and an additional connection bridge(s) may be provided between the touch electrode TCE and the drain electrode DE of the touch thin film transistor T_TFT depending on the number of insulating layers interposed between touch electrode TCE and the drain electrode DE of the touch thin film transistor T_TFT.

In the present exemplary embodiment, when the touch event occurs by the user, the capacitance is formed between the touch tool, e.g., the user's finger, the stylus pen, etc., and the touch electrode TCE, and thus the variation in capacitance of the touch electrode TCE may be sensed.

The touch sensor integrated type display device according to the exemplary embodiment of the present disclosure employs the active matrix type touch sensor, and thus the sensitivity of the touch sensor may significantly increase. The touch sensor may be easily manufactured by using the manufacturing process for the pixel.

According to the exemplary embodiment, the touch cell may further include additional electrodes in addition to the touch electrode TCE.

Figure 11:
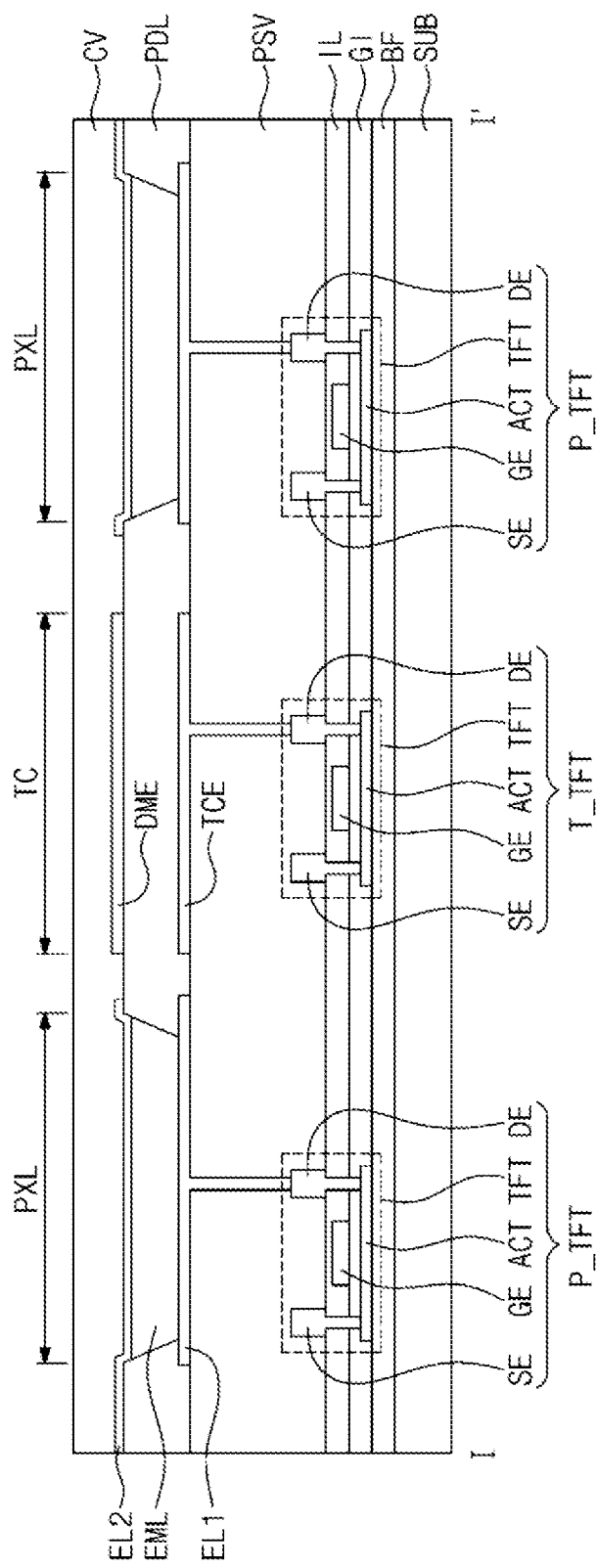
FIG. 11 is a cross-sectional view showing a display device according to another exemplary embodiment of the present disclosure, which corresponds to the line I-I' of FIG. 8.

FIG. 11 is a cross-sectional view showing a display device according to another exemplary embodiment of the present disclosure, which corresponds to the line I-I' of FIG. 8.

Referring to FIG. 11, a touch cell may further include a dummy electrode DME in addition to a touch electrode TCE, and the dummy electrode DME forms a capacitor with the touch electrode TCE and an insulating layer disposed between the dummy electrode DME and the touch electrode TCE. Similar to the above-mentioned embodiment, the touch electrode TCE is disposed on the same layer, i.e., a passivation layer PSV, as a first electrode EL1 of a pixel PXL. The touch electrode TCE is connected to a drain electrode of a touch thin film transistor T_TFT through a contact hole formed through the passivation layer PSV. The touch electrode TCE is spaced apart from the first electrode EL1 by a predetermined distance.

In the present exemplary embodiment, a pixel definition layer PDL is disposed on the touch electrode TCE, and the dummy electrode DME is disposed on the pixel definition layer PDL to overlap with the touch electrode TCE. Accordingly, the dummy electrode DME corresponds to one of two capacitor electrodes spaced apart from each other to allow the pixel definition layer PDL to be disposed between the two capacitor electrodes. The overlap area between the touch electrode TCE and the dummy electrode DME is required to be maximized so that the capacitance between the touch electrode TCE and the dummy electrode DME becomes as large as possible. To this end, the touch electrode TCE and the dummy electrode DME may have the same size and the same shape as each other when viewed in a plan view and may completely overlap each other, however the shape of the touch electrode TCE and the dummy electrode DME should not be limited thereto or thereby. That is, the touch electrode TCE and the dummy electrode DME may have different shapes from each other, or the overlap area between the touch electrode TCE and the dummy electrode DME may vary.

The dummy electrode DME may be manufactured through the same process as the second electrode EL2. Accordingly, the dummy electrode DME may include the same material as the second electrode EL2. The second electrode EL2 has an opening corresponding to an area in which the dummy electrode DME is formed when viewed in a plan view, and the dummy electrode DME is disposed inside the opening.

In the present exemplary embodiment, when the touch event occurs by the user, the capacitance is formed between the touch tool, e.g., the user's finger or the stylus pen, and the dummy electrode DME and between the dummy electrode DME and the touch electrode TCE, and thus a variation in capacitance of the touch electrode TCE may be sensed.

In the case of the touch sensor integrated type display device according to the exemplary embodiment of the present disclosure, the touch sensor may be easily manufactured by using a conventional process. As described above, the touch sensor integrated type display device according to the exemplary embodiment of the present disclosure employs the active matrix type touch sensor, and thus the sensitivity of the touch sensor may significantly increase. Since the touch cells of the touch sensor are formed together with the pixels when the pixels are manufactured, the process of assembling or attaching the touch sensor manufactured by the separate process is omitted, and thus a thickness of the touch sensor integrated type display device decreases. In addition, since the separate manufacturing process of the touch sensor is omitted, a manufacturing process of the touch sensor integrated type display device is simplified, and a manufacturing cost of the touch sensor integrated type display device is reduced.

According to another exemplary embodiment of the present disclosure, the dummy electrode DME may be manufactured to have different configurations from those of the above-mentioned embodiment.

Figure 12:
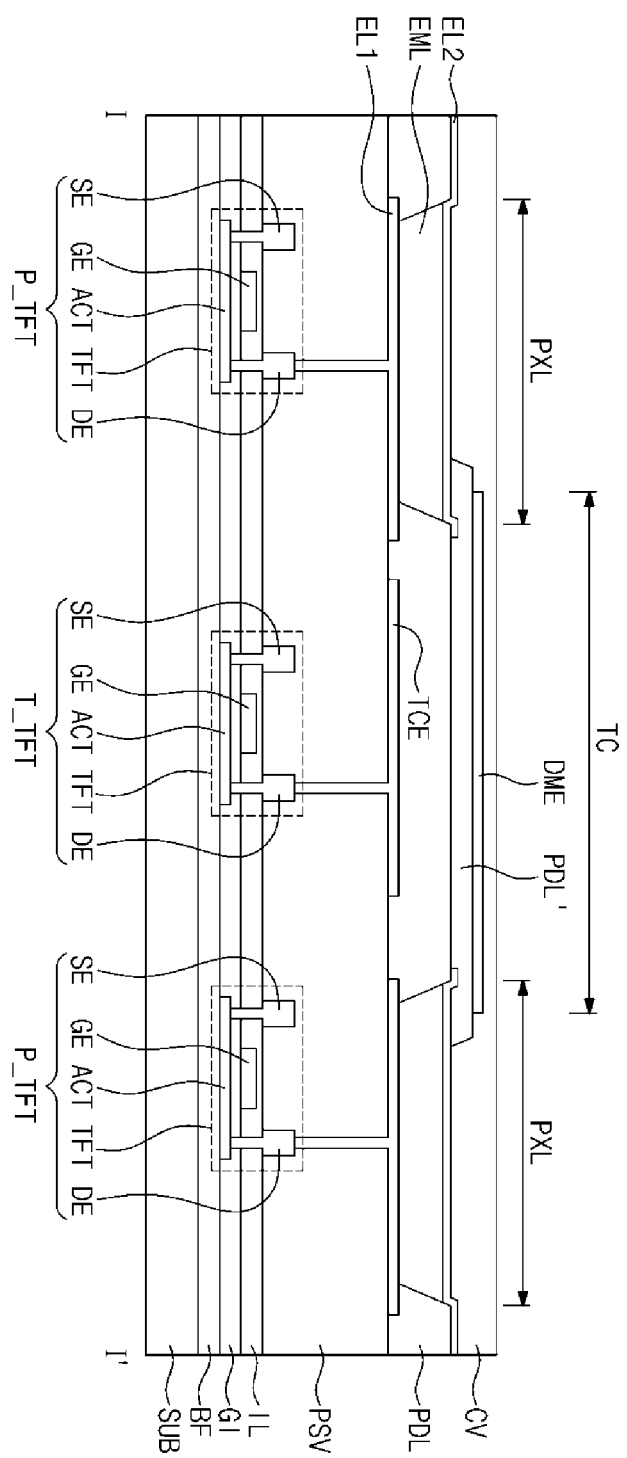
FIG. 12 is a cross-sectional view showing a display device according to another exemplary embodiment of the present disclosure, which corresponds to the line I-I' of FIG. 8.

FIG. 12 is a cross-sectional view showing a display device according to another exemplary embodiment of the present disclosure, which corresponds to the line I-I' of FIG. 8.

Referring to FIG. 12, a touch cell TC includes a touch electrode TCE disposed on an additional pixel definition layer PDL' without being directly formed on the pixel definition layer described in the above-mentioned embodiment. The additional pixel definition layer PDL' is disposed on a pixel definition layer PDL disposed in an area in which the touch cell TC is provided and includes substantially the same material as the pixel definition layer PDL.

In the present exemplary embodiment, the touch electrode TCE is formed to have large area so that a capacitance between the touch electrode TCE and the touch tool such as the user's finger or the stylus pen is maximized. To this end, the additional pixel definition layer PDL' may extend to an area in which a pixel PXL is formed, and the touch electrode TCE disposed on the additional pixel definition layer PDL' may extend to the area in which the pixel PXL is formed. Accordingly, the touch electrode TCE overlaps a second electrode EL2 of the pixel PXL when viewed in a plan view. In the present exemplary embodiment, the touch electrode TCE may be manufactured using the same material as the second electrode EL2. As an example, in a case that the display device is a front surface light emitting type and the second electrode EL2 is a transparent electrode, the touch electrode TCE is formed of a transparent electrode material to prevent a light from the pixel PXL from being blocked.

In the present exemplary embodiment, the touch electrode TCE may have a size greater than that of the touch electrode of the above-mentioned embodiment, and thus the capacitance between the touch electrode TCE and the touch tool increases, thereby increasing the sensitivity with respect to the variation in capacitance. In addition, since the touch electrode TCE may be formed to overlap the second electrode EL2 regardless of the size and position of the second electrode EL2, the degree of freedom on the number of the touch cells TC and the position of the touch electrode TCE connected to the touch cell TC may increase.

In the present exemplary embodiment, the touch electrode TCE makes direct contact with a drain electrode DE of a touch thin film transistor T_TFT, however, this is just for the convenience of explanation. That is, an additional contact hole(s) and an addition connection bridge(s) may be provided between the touch electrode TCE and the drain electrode DE of the touch thin film transistor T_TFT depending on the number of insulating layers interposed between touch electrode TCE and the drain electrode DE of the touch thin film transistor T_TFT.

In the above-described embodiments, the line connecting the touch cell to the touch controller is provided separate from the line connecting the pixel to the driving unit, but they should not be limited thereto or thereby. In the exemplary embodiment of the present disclosure, the touch cell may be driven using the line connected to the pixel, e.g., the data line. That is, the touch cell may be driven by using the data line connected to the pixel without separately forming the touch sensing line in the touch area. In other words, the data line and the touch sensing line may be integrally formed with each other.

Figure 13:
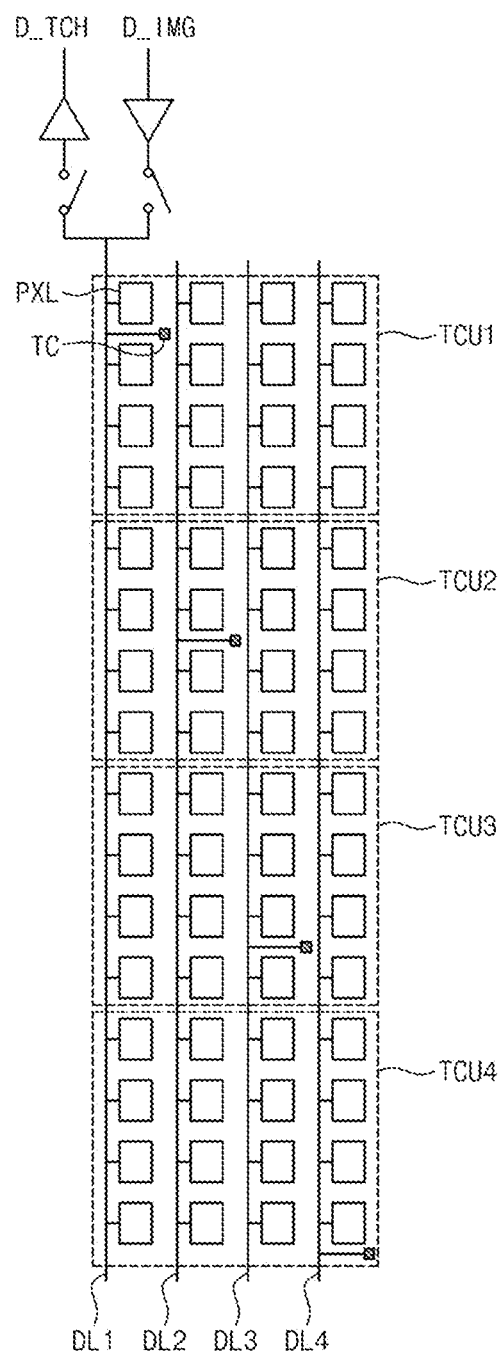
FIG. 13 is a view showing a multiplexer and a pixel of a display device and a touch cell according to an exemplary embodiment of the present disclosure.

FIG. 13 is a view showing a multiplexer, a pixel, and a touch cell of a display device according to an exemplary embodiment of the present disclosure.

For the convenience of explanation, FIG. 13 shows four data lines sequentially arranged, i.e., first, second, third, and fourth data lines DL1, DL2, DL3, and DL4. In addition, the number of pixels PXL corresponding to one touch cell TC is four-by-four (4×4), and four touch units, i.e., first, second, third, and fourth touch units TCU1, TCU2, TCU3, and TCU4, are arranged in a column direction in which the data lines DL1 to DL4 extend. In FIG. 13, for the convenience of explanation, a size of the touch cell TC is reduced, but it should not be limited thereto or thereby. That is, the touch cell TC may have various sizes and shapes in the touch unit. As an example, in a case that the touch electrode of the touch cell is disposed on the same layer as the first electrode or the second electrode, the size of the touch electrode is determined depending on the size or position of the pixel. In this case, when a plurality of touch electrodes is disposed between the pixels and connected to one thin film transistor, an effect similar to that obtained by forming a touch electrode with a wide area may be obtained. On the other hand, when the touch electrode is disposed above the second electrode, the touch electrode may be formed to have relatively large size regardless of the size of the pixel.

Referring to FIG. 13, a multiplexer is provided to each data line. The multiplexer may be connected to a data driving buffer connected to a data driving unit and a current sensing circuit connected to a second touch controller. The data driving buffer receives a data signal D_IMG from the data driving unit, and the current sensing circuit receives a touch sensing signal D_TCH.

In the present exemplary embodiment, the data driving unit and the second touch controller may be multiplexed in a time division manner. Thus, the driving time of the pixel may be maximized, and the touch event may be easily sensed. In particular, according to the exemplary embodiment, the touch cells TC adjacent to each other may be connected to different data lines from each other and different gate lines from each other. As an example, the touch cell TC of the first touch unit TCU1 is connected to the first data line DL1, the touch cell TC of the second touch unit TCU2 is connected to the second data line DL2, and the touch cell TC of the third touch unit TCU3 is connected to the third data line DL3. Accordingly, there is no need to scan all the lines to sense a single touch event. In addition, since the touch cells TC are connected to different lines from each other, the touch sensing operations using all the touch cells TC may be substantially simultaneously performed. As a result, a scan time required to sense the touch event may be significantly reduced.

The touch sensor integrated type display device according to the above-described embodiments may be easily designed and manufactured. The conventional display device is manufactured by manufacturing the touch sensor separate from the display device and attaching the touch sensor to the display device. However, according to the display device of the present disclosure, the touch sensor may be formed by the in-cell structure and substantially simultaneously formed with the pixels through the pixel manufacturing process. Accordingly, the display device becomes smaller, and the touch sensor integrated type display device may be manufactured without performing additional process. In addition, the conventional display device is manufactured by separately manufacturing the touch controller that controls the touch sensing unit and attaching the touch controller to the touch sensing unit, however, the touch controller may be manufactured with the scan driver or the data driver through the same process in the present disclosure.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display device comprising:
    a substrate having a display area and a touch area overlapping the display area;
    a plurality of pixels disposed in the display area;
    a plurality of touch cells disposed in the touch area and individually driven;
    a first driving circuit including:
        a scan driver configured to apply a scan signal to each of a plurality of scan lines, and
        a first touch controller configured to apply a touch driving signal to each of the plurality of touch cells through a touch driving line;
    a second driving circuit including:
        a data driver configured to apply an image signal to each of a plurality of data lines, and
        a second touch controller configured to receive a touch sensing signal from each of the plurality of touch cells through a touch sensing line; and
    a timing controller configured to provide:
        a first touch signal to the first touch controller,
        a second touch signal to the second touch controller,
        a data control signal to the data driver, and
        a gate control signal to the scan driver,
    wherein each of the plurality of touch cells comprises:
        a touch electrode disposed in the touch area; and
        a touch thin film transistor connected to the touch electrode, the touch driving line, and the touch sensing line,
    wherein the touch thin film transistor is configured to connect or disconnect the touch electrode to or from the touch driving line and the touch sensing line,
    wherein the first touch controller is further configured to receive the first touch signal from the timing controller and sequentially output the touch driving signal, and
    wherein the second touch controller is further configured to output a first touch sensing signal in response to the touch driving signal and receive a second touch sensing signal changed according to a user's touch.

2. The display device of claim 1, wherein each of the plurality of pixels comprises:
    a first electrode disposed in the display area;
    a second electrode spaced apart from the first electrode;
    a light emitting layer interposed between the first electrode and the second electrode; and
    a pixel thin film transistor connected to the first electrode.

3. The display device of claim 2, wherein the second electrode and the touch electrode are spaced apart from each other when viewed in a plan view.

4. The display device of claim 3, wherein the touch electrode is disposed on a same layer as the first electrode or the second electrode.

5. The display device of claim 2, wherein at least a portion of the second electrode overlaps at least a portion of the touch electrode.

6. The display device of claim 5, wherein the second electrode is disposed on a different layer from the touch electrode, and wherein an insulating layer is disposed between the second electrode and the touch electrode.

7. The display device of claim 2, wherein each of the pixel thin film transistor and the touch thin film transistor comprises a gate electrode, a source electrode, and a drain electrode, and wherein at least one of the gate electrode, the source electrode, and the drain electrode of the pixel thin film transistor is disposed on a same layer as at least one of the gate electrode, the source electrode, and the drain electrode of the touch thin film transistor.

8. The display device of claim 1, further comprising a dummy electrode disposed to face the touch electrode, wherein an insulating layer is disposed between the dummy electrode and the touch electrode, and wherein the dummy electrode is floated.

9. The display device of claim 1, wherein one of the plurality of scan lines is connected to each pixel thin film transistor; and one of the plurality of data lines is connected to each pixel thin film transistor.

10. The display device of claim 1, wherein each data line and each touch sensing line are integrally formed to form a plurality of integrated lines.

11. The display device of claim 10, further comprising a plurality of multiplexers, wherein each of the plurality of multiplexers is connected to a corresponding integrated line, the data driver, and the second touch controller.

12. A display device comprising:
    a substrate having a display area and a touch area overlapping the display area;
    a plurality of pixels disposed in the display area; and
    a plurality of touch cells disposed in the touch area and individually driven,
    wherein each of the plurality of touch cells comprises:
    a touch electrode electrically connected to a first node;
    a pre-charge circuit electrically connected to the first node and a second node different from the first node to pre-charge the first node and the second node in response to a first signal;
    a charge redistribution circuit electrically connected to the first node and the second node to redistribute charges charged in the first node and the second node in response to a second signal different from the first signal; and
    a sensing circuit electrically connected to the first node to sense a voltage of the first node.

13. The display device of claim 12, wherein the sensing circuit comprises:
    a first transistor selectively turned on or turned off in response to the first node; and
    a second transistor connected to the first transistor in series and selectively turned on or turned off in response to a third signal different from the first and second signals.

14. The display device of claim 12, wherein the pre-charge circuit comprises:
    a third transistor electrically connected to the first node and selectively turned on or turned off in response to the first signal;
    a fourth transistor electrically connected to the third transistor in parallel and selectively turned on or turned off in response to the first signal; and
    a capacitor electrically connected to the second node and the fourth transistor.

15. The display device of claim 14, wherein the charge redistribution circuit comprises a fifth transistor electrically connected to the first node and the second node and selectively turned on or turned off in response to the second signal.

* * * * *